(12) United States Patent
Chen

(10) Patent No.: US 9,311,231 B2
(45) Date of Patent: Apr. 12, 2016

(54) CONNECTING INTERFACE UNIT AND MEMORY STORAGE DEVICE

(71) Applicant: PHISON ELECTRONICS CORP., Miaoli (TW)

(72) Inventor: Wei-Yung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 269 days.

(21) Appl. No.: 14/061,719

(22) Filed: Oct. 23, 2013

(65) Prior Publication Data

US 2015/0052378 A1 Feb. 19, 2015

(30) Foreign Application Priority Data

Aug. 14, 2013 (TW) .............................. 102129148 A

(51) Int. Cl.
*G06F 12/02* (2006.01)
*H04L 7/033* (2006.01)
*G06F 13/40* (2006.01)
*G06F 1/06* (2006.01)

(52) U.S. Cl.
CPC ........ *G06F 12/0246* (2013.01); *G06F 13/4072* (2013.01); *H04L 7/0331* (2013.01); *G06F 1/06* (2013.01); *G06F 2213/3804* (2013.01)

(58) Field of Classification Search
CPC ......... G06F 1/06; G06F 12/0246; H04L 7/00; H03L 7/10; H03L 7/187; H03L 7/113
See application file for complete search history.

(56) References Cited

U.S. PATENT DOCUMENTS

| 6,223,061 | B1 * | 4/2001 | Dacus ................... | H03C 3/095 455/522 |
| 6,489,851 | B1 * | 12/2002 | Miyada ................... | H03L 7/087 327/156 |
| 6,738,922 | B1 | 5/2004 | Warwar et al. | |
| 7,821,343 | B1 * | 10/2010 | Wong ........................ | H03L 7/23 327/147 |
| 2003/0103591 | A1 * | 6/2003 | Noguchi ................. | H03L 7/087 375/376 |
| 2005/0058235 | A1 * | 3/2005 | Beeson ................ | H03D 13/004 375/376 |
| 2006/0197564 | A1 * | 9/2006 | Yen ......................... | H03L 7/113 327/156 |

(Continued)

FOREIGN PATENT DOCUMENTS

TW 201321974 6/2013

OTHER PUBLICATIONS

"Office Action of Taiwan Counterpart Application", issued on Aug. 5, 2015, p. 1-p. 7.

*Primary Examiner* — Jaweed A Abbaszadeh
*Assistant Examiner* — Brian J Corcoran
(74) *Attorney, Agent, or Firm* — Jianq Chyun IP Office

(57) ABSTRACT

A connecting interface unit and a memory storage device without a crystal oscillator are provided and include a frequency detector, a phase detector, an oscillator, a sampling circuit and a transmitter circuit. The frequency detector and the phase detector respectively detect frequency difference and phase difference between an input signal from a host system and a reference signal to generate a frequency signal and a phase signal. The frequency signal and the phase signal that have passed through a filter are transmitted to the oscillator to generate the reference signal for generating a clock signal. The sampling circuit generates an input data signal according to the reference signal. The transmitter circuit modulates an output data signal according to the clock signal to generate and transmit an output signal to the host system. Accordingly, the connecting interface unit conforms to the specification of a transmission stand.

28 Claims, 14 Drawing Sheets

(56) References Cited

U.S. PATENT DOCUMENTS

| | | |
|---|---|---|
| 2007/0009073 A1 | 1/2007 | Kushiyama |
| 2008/0209112 A1* | 8/2008 | Yu ................... G06F 12/0246 711/103 |
| 2009/0140782 A1* | 6/2009 | Huang ................ H03K 23/68 327/156 |
| 2011/0016346 A1* | 1/2011 | Lee ........................ G06F 1/12 713/503 |
| 2011/0202780 A1* | 8/2011 | Ko ....................... G06F 1/3203 713/320 |
| 2012/0020404 A1* | 1/2012 | Hsieh ............... H04L 25/03006 375/231 |
| 2012/0049909 A1* | 3/2012 | Lin ..................... H04L 7/0331 327/156 |

\* cited by examiner

| Temperature | Voltage V_t (digital data) | Code used by the digital oscillator |
|---|---|---|
| ? | 0.80 | 10040 |
| 20 | 0.78 | 10030 |
| 30 | 0.76 | 10020 |
| 40 | 0.74 | 10010 |
| 50 | 0.72 | 10000 |
| 60 | 0.7 | 9990 |
| ⋮ | ⋮ | ⋮ |
| 100 | 0.62 | 9923 |
| ? | 0.6 | 9903 |

1200

CONNECTING INTERFACE UNIT AND MEMORY STORAGE DEVICE

CROSS-REFERENCE TO RELATED APPLICATION

This application claims the priority benefit of Taiwan application serial no. 102129148, filed on Aug. 14, 2013. The entirety of the above-mentioned patent application is hereby incorporated by reference herein and made a part of this specification.

BACKGROUND

1. Technology Field

The invention relates to a connecting interface unit, and more particularly, to a connecting interface unit not including a crystal oscillator, and to a memory storage device using the connecting interface unit.

2. Description of Related Art

Along with the rapid growth of the market for digital cameras, cell phones, and MP3 players in recent years, consumers' demand for storage media has increased drastically. Due to their characteristics such as data non-volatility, low power consumption, compact size, and non-mechanical structure, rewritable non-volatile memory modules (e.g. flash memory) are very suitable for being built in the above exemplified portable multimedia devices.

Generally speaking, a rewritable non-volatile memory module is coupled to a host system via a connecting interface unit. Such connecting interface unit is compliant with a transmission standard, for example, a Universal Serial Bus (USB) standard. Data transmitted between the host system and the connecting interface unit is transmitted at a specific frequency. Hence the connecting interface unit is required to be able to generate a clock signal at this specific frequency. In order to comply with the specification of the transmission standard, the frequency of such clock signal must be stable. Accordingly, the clock signal is generally generated by a crystal oscillator disposed in the connecting interface unit. However, compared to other types of oscillators, crystal oscillators cost more. Besides, as the connecting interface unit changes in temperature, the characteristics of the oscillators may be altered so that deviation occurs in the frequency of the clock signal. Therefore, persons skilled in the art are concerned about how to design a connecting interface unit without use of a crystal oscillator and to make the connecting interface unit comply with the specification of a transmission standard.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a connecting interface unit and a memory storage device that comply with the specification of a transmission standard without using a crystal oscillator.

An exemplary embodiment of the invention provides a connecting interface unit not including a crystal oscillator. The connecting interface unit includes a frequency detector, a phase detector, at least one filter, an oscillator, a first sampling circuit and a transmitter circuit. The frequency detector is configured to receive an input signal from a host system, and to detect a frequency difference between the input signal and a first reference signal to generate a first frequency signal. The phase detector is configured to receive the input signal, and to detect a phase difference between the input signal and the first reference signal to generate a first phase signal. The filter is configured to filter the first frequency signal to generate a second frequency signal, and to filter the first phase signal to generate a second phase signal. The oscillator is coupled to the filter, the frequency detector and the phase detector, and is configured to oscillate according to the second frequency signal and the second phase signal to generate the first reference signal, wherein the first reference signal is for generating a clock signal. The first sampling circuit is coupled to the oscillator and is configured to generate an input data signal according to the first reference signal. The transmitter circuit is configured to modulate an output data signal according to the clock signal to generate an output signal, and to transmit the output signal to the host system.

In another aspect, an exemplary embodiment of the invention proposes a memory storage device including a connecting interface unit, a rewritable non-volatile memory module and a memory controller. The connecting interface unit is configured to be coupled to a host system, and does not include a crystal oscillator. The rewritable non-volatile memory module includes a plurality of physical erasing units. The memory controller is coupled to the connecting interface unit and the rewritable non-volatile memory module. The connecting interface unit includes a frequency detector, a phase detector, at least one filter, an oscillator, a first sampling circuit and a transmitter circuit. The frequency detector is configured to receive an input signal from a host system, and to detect a frequency difference between the input signal and a first reference signal to generate a first frequency signal. The phase detector is configured to receive the input signal, and to detect a phase difference between the input signal and the first reference signal to generate a first phase signal. The filter is configured to filter the first frequency signal to generate a second frequency signal, and to filter the first phase signal to generate a second phase signal. The oscillator is coupled to the filter, the frequency detector and the phase detector, and is configured to oscillate according to the second frequency signal and the second phase signal to generate the first reference signal, wherein the first reference signal is for generating a clock signal. The first sampling circuit is coupled to the oscillator and is configured to generate an input data signal according to the first reference signal. The transmitter circuit is configured to modulate an output data signal according to the clock signal to generate an output signal, and to transmit the output signal to the host system.

Based on the above, the connecting interface unit and the memory storage device proposed by the exemplary embodiments of the invention make it possible to generate a clock signal by means of the input signal from the host system, and the clock signal is utilized for transmitting data to the host system. In this way, there is no need to dispose a crystal oscillator in the connecting interface unit.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, embodiments accompanied with drawings are described in detail as follows.

DETAILED DESCRIPTION OF DISCLOSED EMBODIMENTS

[First Exemplary Embodiment]

Generally speaking, a memory storage device (also referred as memory storage system) includes a rewritable non-volatile memory module and a controller (also referred as control circuit). The memory storage device is normally used together with a host system, so that the host system writes data into or reads data from the memory storage device.

Figure 1A:
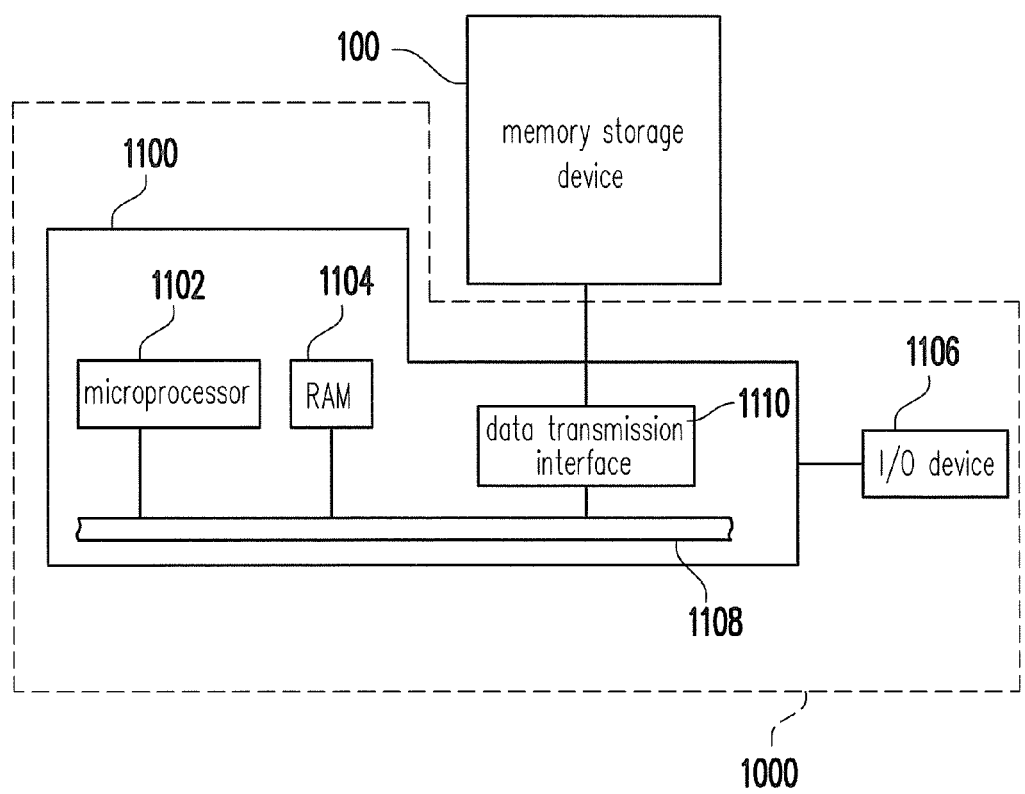
FIG. 1A illustrates a host system and a memory storage device according to an exemplary embodiment of the invention.

FIG. 1A illustrates a host system and a memory storage device according to an exemplary embodiment of the invention.

Figure 1B:
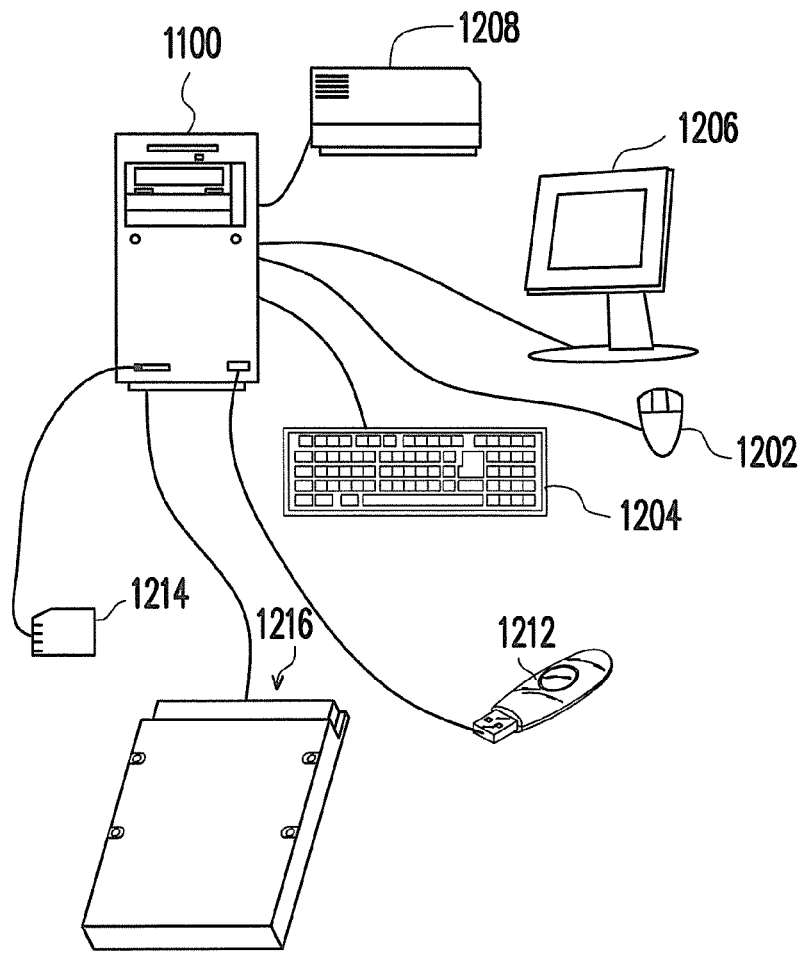
FIG. 1B is a schematic diagram of a computer, an input/output device, and a memory storage device according to an exemplary embodiment of the invention.

Referring to FIG. 1A, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices shown in FIG. 1B are not intended to limit the I/O device 1106, and the I/O device 1106 may further include other devices.

According to an exemplary embodiment of the invention, a memory storage device 100 is coupled to other elements of the host system 1000 through the data transmission interface 1110. By using the microprocessor 1102, the RAM 1104 and the I/O device 1106, the data is written in or read from the memory storage device 100. For instance, the memory storage device 100 may be a rewritable non-volatile memory storage device, such as a flash drive 1212, a memory card 1214, or a solid state drive (SSD) 1216, as shown in FIG. 1B.

Figure 1C:
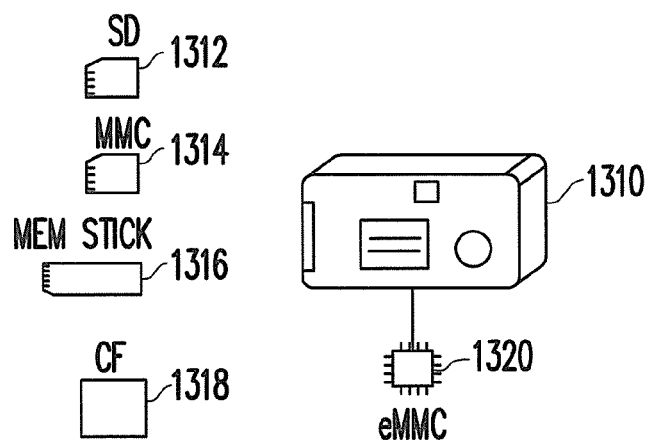
FIG. 1C is a schematic diagram of a host system and a memory storage device according to an exemplary embodiment of the invention.

Generally speaking, the host system 1000 is any system substantially operated in combination with the memory storage device 100 for storing data. Even though the host system 1000 is described as a computer system in the present exemplary embodiment, in another exemplary embodiment of the invention, the host system 1000 may be a digital camera, a video camera, a telecommunication device, an audio player, or a video player. For instance, in a case where the host system is a digital camera (video camera) 1310, the rewritable non-volatile memory storage device is then a Secure Digital (SD) card 1312, a MultiMediaCard (MMC) 1314, a memory stick 1316, a CompactFlash (CF) card 1318 or an embedded storage device 1320 (as shown in FIG. 1C). The embedded storage device 1320 includes an embedded MMC (e-MMC). It is worth mentioning that the e-MMC is directly coupled to a substrate of the host system.

Figure 2:
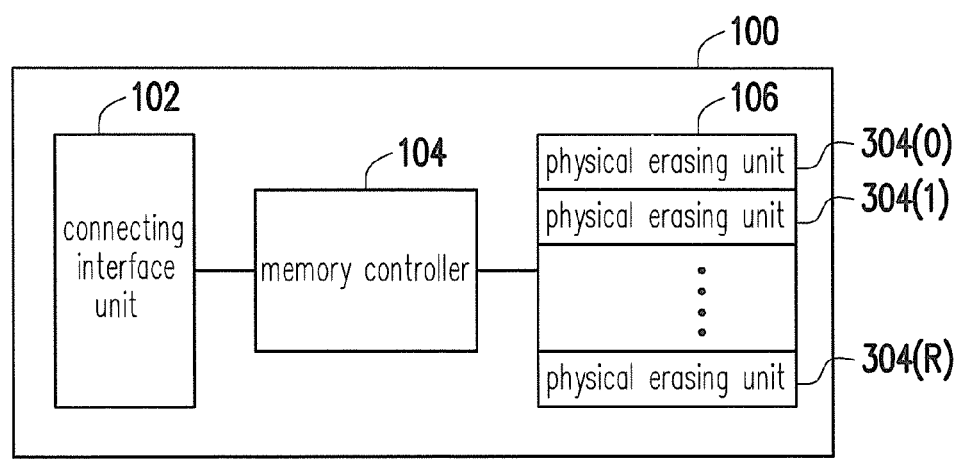
FIG. 2 is a schematic block diagram of the memory storage device shown in FIG. 1A.

FIG. 2 is a schematic block diagram of the memory storage device shown in FIG. 1A.

Referring to FIG. 2, the memory storage device 100 includes a connecting interface unit 102, a memory controller 104, and a rewritable non-volatile memory module 106.

In the present exemplary embodiment, the connecting interface unit 102 is compliant with a Universal Serial Bus (USB) standard. However, it should be understood that the invention is not limited thereto. The connecting interface unit 102 may also be compliant with a Parallel Advanced Technology Attachment (PATA) standard, an Institute of Electrical and Electronic Engineers (IEEE) 1394 standard, a Peripheral Component Interconnect Express (PCI Express) standard, a Serial Advanced Technology Attachment (SATA) standard, a Secure Digital (SD) interface standard, an Ultra-High Speed-I (UHS-I) interface standard, an Ultra-High Speed-II (UHS-II) interface standard, a Memory Stick (MS) interface standard, a MultiMediaCard (MMC) interface standard, an embedded MultiMediaCard (e-MMC) interface standard, a Universal Flash Storage (UFS) interface standard, a CompactFlash (CF) interface standard, an Integrated Drive Electronics (IDE) standard, or other suitable standards. The connecting interface unit 102 is packaged with the memory controller 104 in a chip. Or, the connecting interface unit 102 is disposed outside a chip containing the memory controller 104.

The memory controller 104 is configured to execute a plurality of logic gates or control commands implemented in a hardware form or in a firmware form, and to perform operations such as data writing, data reading and data erasing in the rewritable non-volatile memory module 106 according to the commands of the host system 1000.

The rewritable non-volatile memory module 106 is coupled to the memory controller 104 and is configured to store the data written by the host system 1000. The rewritable non-volatile memory module 106 includes physical erasing units 304(0)-304(R). For instance, the physical erasing units 304(0)-304(R) may belong to the same memory die or different memory dies. Each physical erasing unit has a plurality of physical programming units, and the physical programming units that belong to the same physical erasing unit may be written independently and be erased simultaneously. For instance, each physical erasing unit consists of 128 physical programming units. However, it should be understood that the invention is not limited thereto. Each physical erasing unit may consist of 64, 256, or any other number of physical programming units.

More specifically, each physical erasing unit includes a plurality of word lines and a plurality of bit lines, a memory cell is disposed at the intersection of each word line and bit line. Each memory cell stores one or more bits. In the same physical erasing unit, all memory cells are erased simultaneously. In the present exemplary embodiment, physical erasing unit is the smallest unit for erasing. That is to say, each physical erasing unit has a minimum number of memory cells for being erased altogether. For instance, a physical erasing unit is a physical block. In addition, the memory cells on the same word line compose one or more physical programming units. If each memory cell stores two or more bits, the physical programming units on the same word line are classified into lower physical programming units and upper physical programming units. Generally speaking, a write-in speed of the lower physical programming units is faster than that of the upper physical programming units. In the present exemplary embodiment, physical programming unit is the smallest unit for programming. That is to say, physical programming unit is the smallest unit for writing data. For instance, a physical programming unit is a physical page or physical sector. In the event that the physical programming unit is a physical page, each physical programming unit normally includes a data bit area and a redundant bit area. The data bit area includes a plurality of physical sectors and is configured to store user data, while the redundant bit area is configured to store system data (e.g. an error checking and correcting (ECC) code). In the present exemplary embodiment, each data bit area includes 32 physical sectors with each physical sector being 512 bytes (B). However, in other exemplary embodiments, one data bit area may include 8, 16, or more or fewer physical sectors. The invention does not limit the size or number of the physical sectors.

In the present exemplary embodiment, the rewritable non-volatile memory module 106 is a multi-level cell (MLC) NAND flash memory module. That is, one memory cell stores at least two bits. However, the invention is not limited thereto. The rewritable non-volatile memory module 106 may also be a single-level cell (SLC) NAND flash memory module, a trinary-level cell (TLC) NAND flash memory module, any other type of flash memory module, or any other memory module having the same characteristics.

Figure 3:
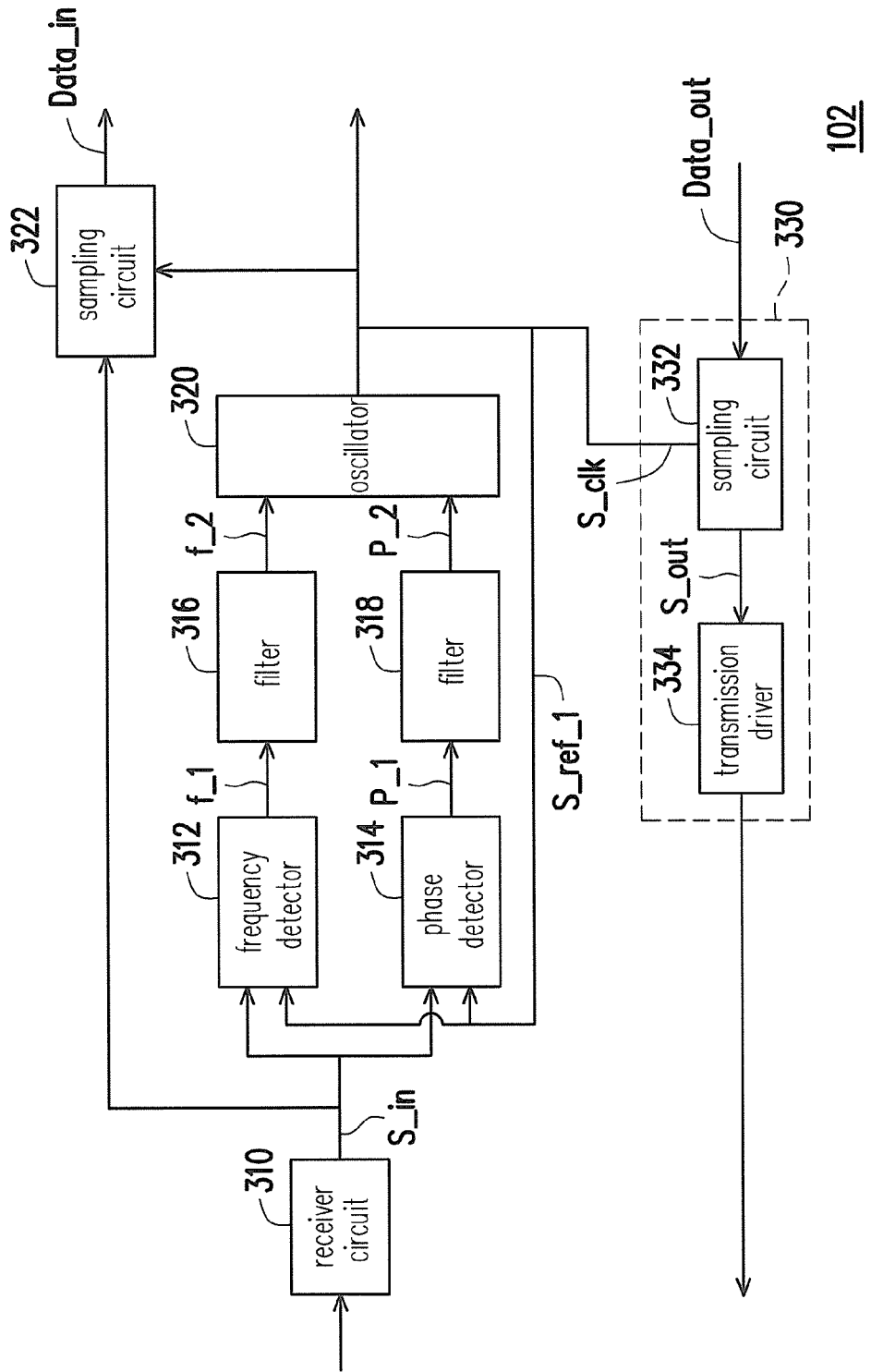
FIG. 3 is a partial block diagram of a connecting interface unit according to the first exemplary embodiment.

FIG. 3 is a partial block diagram of a connecting interface unit according to the first exemplary embodiment.

Referring to FIG. 3, the connecting interface unit 102 includes the receiver circuit 310, a frequency detector 312, a phase detector 314, a filter 316, a filter 318, an oscillator 320, a sampling circuit 322 (also referred as first sampling circuit), and a transmitter circuit 330. It is worth noting that the connecting interface unit 102 may include other circuits but not include a crystal oscillator.

The receiver circuit 310 is configured to receive a signal from a host system 1000 and to provide an input signal Sin. In the present exemplary embodiment, the receiver circuit 310 is an equalizer. Nonetheless, the receiver circuit 310 may also be a limiting amplifier, a transimpedence amplifier, or any other circuit for receiving signals from the host system 1000. The invention is not limited thereto. In addition, the receiver circuit 310 performs treatments such as compensation or filtering on the signal that is input. The frequency detector 312 does not receive a reference clock from a crystal oscillator. The frequency detector 312 receives the input signal S_in, and detects a frequency difference between the input signal S_in and a first reference signal S_ref_1 to generate a first frequency signal f_1. For instance, the first frequency signal f_1 serves to indicate that whether a frequency of the input signal S_in is higher than, lower than or equal to a frequency of the first reference signal S_ref_1. The filter 316 filters the first frequency signal f_1 to generate a second frequency signal f_2. The phase detector 314 does not receive a reference clock from a crystal oscillator. The phase detector 314 receives the input signal S_in, and detects a phase difference between the input signal S_in and the first reference signal S_ref_1 to generate a first phase signal P_1. For instance, the first phase signal P_1 serves to indicate that whether a phase of the input signal S_in leads, lags behind or is the same as a phase of the first reference signal S_ref_1. The filter 318 filters the first phase signal P_1 to generate a second phase signal P_2.

In the present exemplary embodiment, both the filter 316 and the filter 318 are low-pass filters. However, in another exemplary embodiment, the filter 316 and the filter 318 may be combined and implemented as one filter. The filter receives the first frequency signal f_1 and the first phase signal P_1 to generate the corresponding second frequency signal f_2 and second phase signal P_2. In an exemplary embodiment, a charge pump may be disposed between the frequency detector 312 and the filter 316, and also between the phase detector 314 and the filter 318. The invention is not limited thereto.

The oscillator 320 is coupled to the filter 316, the filter 318, the frequency detector 312 and the phase detector 314, and oscillates according to the second frequency signal f_2 and the second phase signal P_2 to generate the first reference signal S_ref_1. In the present exemplary embodiment, the oscillator 320 is a voltage-controlled oscillator, such as a Hartley oscillator, a Colpitts oscillator, a Clapp oscillator, a phase-shift oscillator, an RC oscillator, an LC oscillator, or other non-crystal oscillator. In another exemplary embodiment, the oscillator 320 is a digital oscillator. In that case, an analog-to-digital converter is disposed between the filter 316 and the oscillator 320, and also between the filter 318 and the oscillator 320.

The sampling circuit 322 is coupled to the oscillator 320 and is configured to generate an input data signal Data_in according to the first reference signal S_ref_1. For example, the sampling circuit 322 samples the input signal S_in according to the first reference signal S_ref_1 so as to obtain the input data signal Data_in. The input data signal Data_in is, for example, a write-in command, a read command, a written data, or any other command or data issued by the host system 1000. The invention does not limit the content of the input data signal Data_in. It is worth noting that, if the host system 1000 is not transmitting data to the memory storage device 100, an amplitude of the input signal S_in is smaller than a threshold value (i.e. the input signal S_in only includes some noise). This threshold value is, for example, a numerical value defined by the transmission standard. However, the invention does not limit the value of the threshold value. In other words, if the amplitude of the input signal S_in is smaller than the threshold value, the input signal S_in does not include the input data signal Data_in.

The first reference signal S_ref_1 is for generating a clock signal S_clk. In the present exemplary embodiment, the first reference signal S_ref_1 is the same as the clock signal S_clk. Other patterns will be described in the following. The transmitter circuit 330 modulates an output data signal Data_out according to the clock signal S_clk to generate an output signal S_out, and transmits the output signal S_out to the host system 1000. For instance, the transmitter circuit 330 includes a sampling circuit 332 (also referred as second sampling circuit) and the transmission driver 334. The sampling circuit 332 modulates the output data signal Data_out, and the transmission driver 334 transmits the output signal S_out to the host system 1000. The transmitter circuit 330 is, for example, a current-mode logic (CML) transmitter, a low-voltage differential signaling (LVDS) transmitter, or any other signal transmitting circuit for transmitting signals to other devices. Meanwhile, the output data signal Data_out is the data to be transmitted from the memory controller 104 to the host system 1000, and is, for example, the system data or user data stored in the physical erasing units 304(0)-304(R). However, the invention also does not limit the content of the output data signal Data_out.

In an exemplary embodiment, the input signal S_in has a fixed base frequency, for example, 5 GHz (gigahertz). By feedbacking the first reference signal S_ref_1 to the frequency detector 312 and the phase detector 314, after the input signal S_in is received for a while, the first reference signal S_ref_1 is gradually locked at the frequency of 5 GHz. Particularly, in the present exemplary embodiment, the transmitter circuit 330 receives the clock signal S_clk generated by the oscillator, and modulates the output data signal Data_out according to the clock signal S_clk, so that the output signal S_out is also at the frequency of 5 GHz. And, the transmitter circuit 330 does not receive a reference clock from a crystal oscillator. In this way, there is no need to additionally dispose a crystal oscillator in the transmitter circuit 330 for obtaining a precise base frequency.

Figure 4:
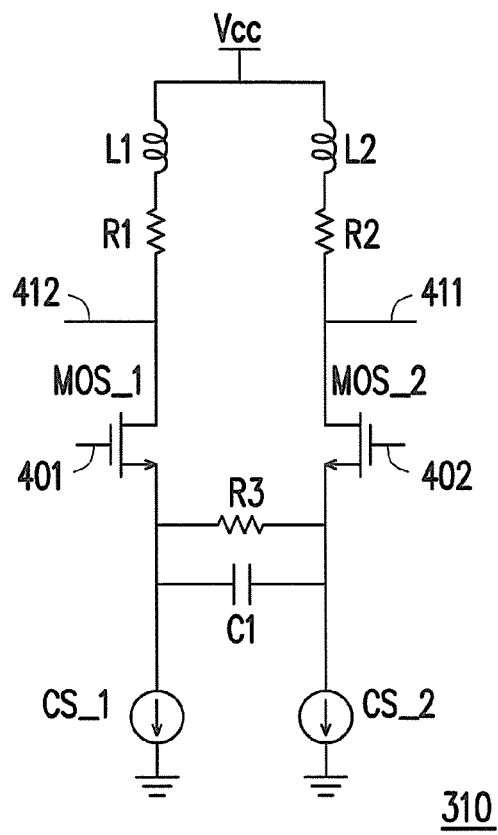
FIG. 4 is a circuit diagram of a receiver circuit 310 according to the first exemplary embodiment.

FIG. 4 is a circuit diagram of the receiver circuit 310 according to the first exemplary embodiment. Referring to FIG. 4, the signals from the host system 1000 are input via terminals 401 and 402, wherein a voltage at the terminal 402 is a reference voltage. Specifically, the terminal 401 is coupled to a control terminal of a transistor MOS_1. A first terminal (drain terminal) of the transistor MOS_1 is coupled to a first terminal of a resistor R1. A second terminal of the resistor R1 is coupled to a second terminal of an inductor L1. A first terminal of the inductor L1 is coupled to a system voltage Vcc. A second terminal (source terminal) of the transistor MOS_1 is coupled to a first terminal of a resistor R3, a first terminal of a capacitor C1, and a current source CS_1. The terminal 402 is coupled to a control terminal of a transistor MOS_2. A first terminal (drain terminal) of the transistor MOS_2 is coupled to a second terminal of a resistor R2. A first terminal of the resistor R2 is coupled to a second terminal of an inductor L2. A first terminal of the inductor L2 is coupled to the system voltage Vcc. A second terminal (source terminal) of the transistor MOS_2 is coupled to a second terminal of the resistor R3, a second terminal of the capacitor C1, and a current source CS_2. A potential difference between terminals 412 and 411 form the input signal S_in, wherein a voltage at the terminal 412 is a reference voltage. In an exemplary embodiment, the receiver circuit 310 is configured to adjust an input impedance.

Figure 5:
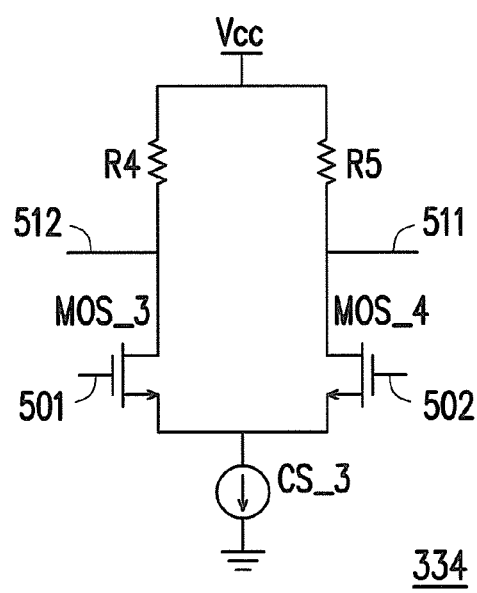
FIG. 5 is a circuit diagram of a transmission driver 334 according to the first exemplary embodiment.

FIG. 5 is a circuit diagram of the transmission driver 334 according to the first exemplary embodiment. Referring to FIG. 5, the output data signal Data_out is input via terminals 501 and 502, wherein a voltage at the terminal 502 is a reference voltage. The terminal 501 is coupled to a control terminal of a transistor MOS_3. A second terminal (source terminal) of the transistor MOS_3 is coupled to a current source CS_3. A first terminal (drain terminal) of the transistor MOS_3 is coupled to a second terminal of a resistor R4. A first terminal of the resistor R4 is coupled to the system voltage Vcc. The terminal 502 is coupled to a control terminal of a transistor MOS_4. A second terminal (source terminal) of the transistor MOS_4 is coupled to the current source CS_3. A first terminal (drain terminal) of the transistor MOS_4 is coupled to a second terminal of a resistor R5. A first terminal of the resistor R5 is coupled to the system voltage Vcc. A potential difference between terminals 511 and 512 form the output signal S_out transmitted to the host system 1000, wherein a voltage at the terminal 512 is a reference voltage. In an exemplary embodiment, the transmission driver 334 is configured to change a level of the output signal S_out without changing the phase or frequency of the output signal S_out.

[Second Exemplary Embodiment]

Figure 6:
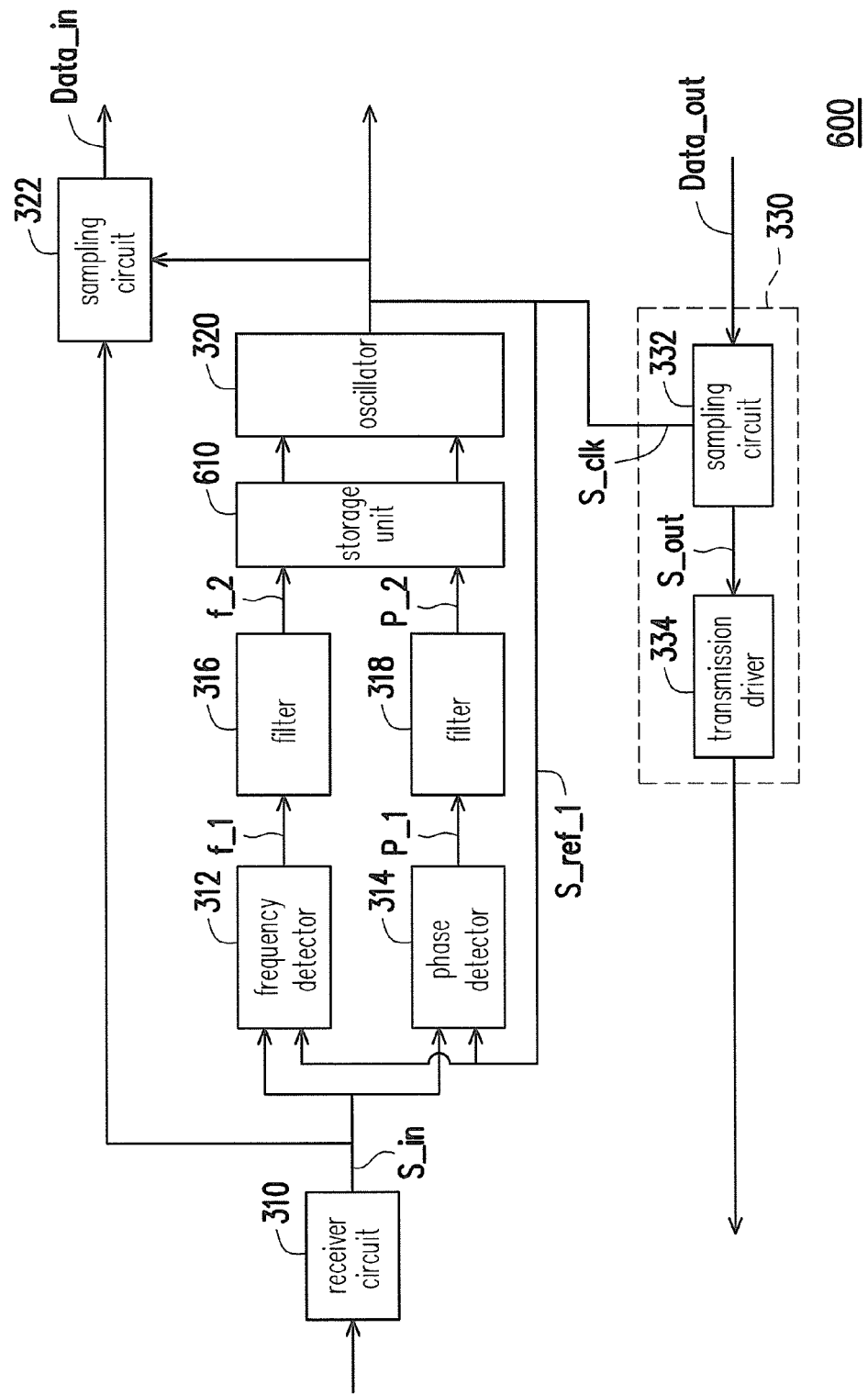
FIG. 6 is a partial block diagram of a connecting interface unit according to the second exemplary embodiment.

Elements in the second exemplary embodiment are partially the same as those in the first exemplary embodiment, and only differences are described in the following. FIG. 6 is a partial block diagram of a connecting interface unit according to the second exemplary embodiment. Referring to FIG. 6, in addition to the elements illustrated in FIG. 3, a connecting interface unit 600 further includes the storage unit 610. The storage unit 610 is coupled to the filter 316, the filter 318 and the oscillator 320. If the amplitude of the input signal S_in conforms to a threshold condition (e.g. is equal to or greater than a threshold value), the storage unit 610 is configured to store an oscillation information of the second frequency signal f_2 and the second phase signal P_2. When no input signal S_in is received, the amplitude of the input signal S_in does not conform to the threshold condition (e.g. is smaller than the threshold value), the input signal S_in is unstable, or the input signal S_in does not include the input data signal Data_in, the storage unit 610 provides the stored oscillation information to the oscillator 320, and the oscillator 320 oscillates according to the oscillation information to generate the first reference signal S_ref_1. Specifically, in the case where the oscillator 320 is a voltage-controlled oscillator, the oscillation information is a level of the second frequency signal f_2 or a level of the second phase signal P_2. In the case where the oscillator 320 is a digital oscillator, the storage unit 610 further includes an analog-to-digital converter configured to convert the second frequency signal f_2 or the second phase signal P_2 into a code (to become the oscillation information), and such code is stored in the storage unit 610. Through the connecting interface unit 600 in FIG. 6, if the host system 1000 stops transmitting data to the memory storage device 100 while some data is intended to be transmitted from the memory controller 104 to the host system 1000, it is still possible for the oscillator 320 to provide the first reference signal S_ref_1 according to the oscillation information in the storage unit 610, so that the transmitter circuit 330 operates normally.

Figure 7:
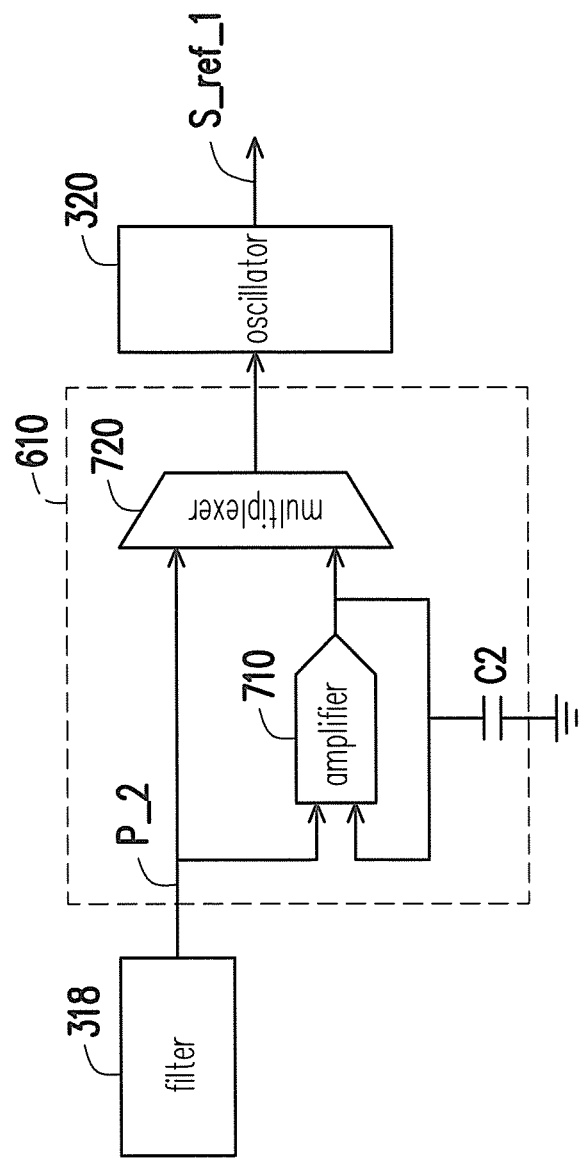
FIG. 7 is a circuit diagram of a storage unit 610 according to the second exemplary embodiment.

FIG. 7 is a circuit diagram of the storage unit 610 according to the second exemplary embodiment. Referring to FIG. 7, in the exemplary embodiment of FIG. 7, the oscillator 320 is a voltage-controlled oscillator, and the storage unit 610 is configured to store the level of the second phase signal P_2. Specifically, the storage unit 610 includes an amplifier 710 and a multiplexer 720. A first terminal of the amplifier 710 is coupled to the filter 318, and a second terminal of the amplifier 710 is coupled to an output terminal of the amplifier 710. The output terminal of the amplifier 710 is coupled to a first terminal of a capacitor C2, and a second terminal of the capacitor C2 is coupled to a ground terminal. A first terminal of the multiplexer 720 is coupled to the filter 318, a second terminal of the multiplexer 720 is coupled to the output terminal of the amplifier 710, and an output terminal of the multiplexer 720 is coupled to the oscillator 320. When the amplitude of the input signal S_in conforms to the threshold condition, the capacitor C2 stores the level of the second phase signal P_2, and the multiplexer 720 outputs a signal at the first terminal thereof (i.e. the second phase signal P_2) to the oscillator 320. When the amplitude of the input signal S_in does not conform to the threshold condition, the multiplexer 720 outputs a signal at the second terminal thereof (i.e. the level stored in the capacitor C2) to the oscillator 320. In an exemplary embodiment, the capacitor C2 is implemented as a transistor, and the transistor has a relatively thicker oxide layer, thereby preventing occurrence of leakage in the stored level.

In the exemplary embodiment of FIG. 7, the storage unit 610 includes only one set of the amplifier 710 and the multiplexer 720 for storing the level of the second phase signal P_2. However, in another exemplary embodiment, the storage unit 610 includes an additional set of an amplifier and a multiplexer for storing the level of the second frequency signal f_2. The additional set of the amplifier and the multiplexer operates in the same way as the amplifier 710 and the multiplexer 720, and thus is not described further herein.

[Third Exemplary Embodiment]

Figure 8:
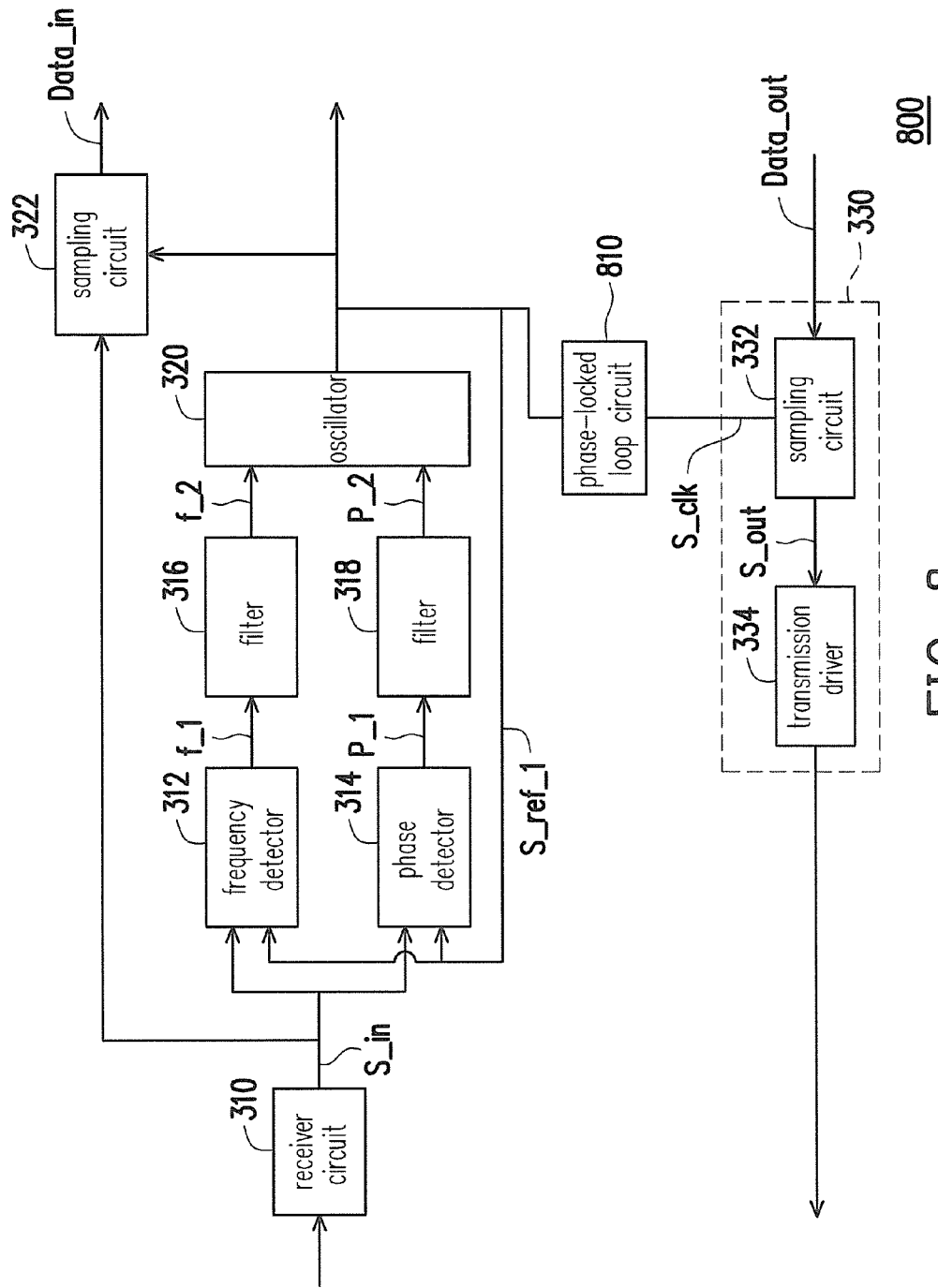
FIG. 8 is a partial block diagram of a connecting interface unit according to the third exemplary embodiment.

Elements in the third exemplary embodiment are partially the same as those in the first exemplary embodiment, and only differences are described in the following. FIG. 8 is a partial block diagram of a connecting interface unit according to the third exemplary embodiment. Referring to FIG. 8, in addition to the elements illustrated in FIG. 3, a connecting interface unit 800 further includes a phase-locked loop circuit 810. The phase-locked loop circuit 810 is coupled to the oscillator 320 and the transmitter circuit 330, and is configured to generate the clock signal S_clk according to the first reference signal S_ref_1, so as to filter out high-frequency noise or jitter quantity of the first reference signal S_ref_1. In an exemplary embodiment, the phase-locked loop circuit 810 has a relatively small bandwidth. Accordingly, the generated clock signal S_clk has smaller jitter as compared to the first reference signal S_ref_1.

[Fourth Exemplary Embodiment]

Figure 9:
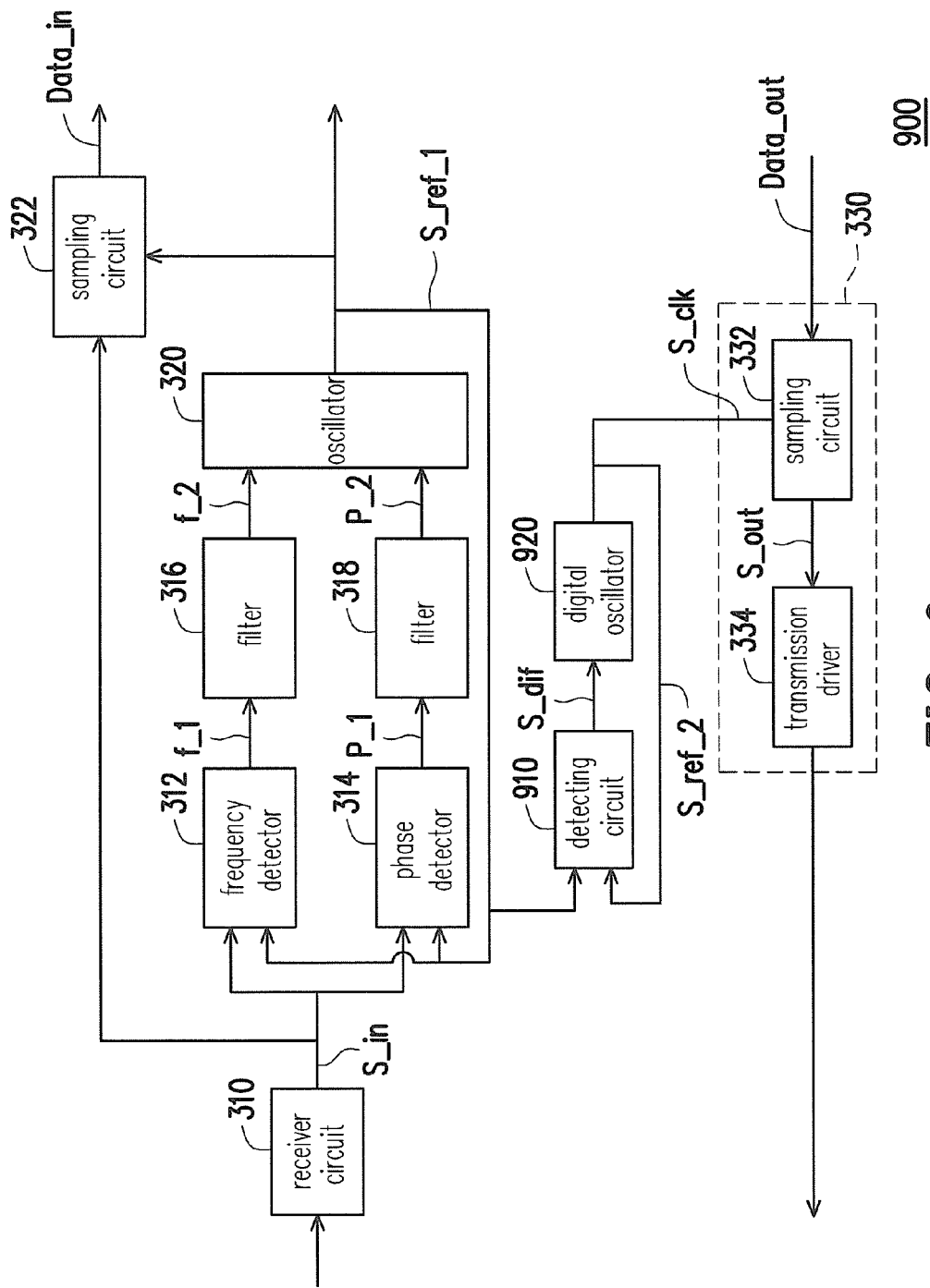
FIG. 9 is a partial block diagram of a connecting interface unit according to the fourth exemplary embodiment.

Elements in the fourth exemplary embodiment are partially the same as those in the first exemplary embodiment, and only differences are described in the following. FIG. 9 is a partial block diagram of a connecting interface unit according to the fourth exemplary embodiment. Referring to FIG. 9, in addition to the elements illustrated in FIG. 3, a connecting interface unit 900 further includes a detecting circuit 910 and a digital oscillator 920. The detecting circuit 910 detects a signal character difference between the first reference signal S_ref_1 and a second reference signal S_ref_2 to generate a difference signal S_dif. For instance, the signal character difference is a frequency difference or a phase difference, and the detecting circuit 910 may be a frequency detector, a phase detector or a phase frequency detector. The digital oscillator 920 oscillates according to the difference signal S_dif to generate the second reference signal S_ref_2. The second reference signal S_ref_2 is for generating the clock signal S_clk. For instance, the second reference signal S_ref_2 is the same as the clock signal S_clk. In the present exemplary embodiment, the digital oscillator 920 is an LC oscillator, and the second reference signal S_ref_2 is at a frequency of 5 GHz. However, in other exemplary embodiments, the oscillator 920 may be other type of oscillator or may be replaced with a voltage-controlled oscillator. The invention is not limited thereto.

In an exemplary embodiment, a storage unit is further disposed between the detecting circuit 910 and the digital oscillator 920. The storage unit is configured to store the difference signal S_dif when the amplitude of the input signal S_in conforms to the threshold condition, and to provide the stored difference signal S_dif to the digital oscillator 920 when the amplitude of the input signal S_in does not conform to the threshold condition. In the present exemplary embodiment, the difference signal S_dif is a digital signal. The digital oscillator 920 regards the difference signal S_dif as a code. The codes having different numerical values enable the digital oscillator 920 to output the second reference signals S_ref_2 at different frequencies. However, when the digital oscillator 920 varies in temperature, the codes having the same numerical value may generate the second reference signals S_ref_2 at different frequencies. For instance, when the amplitude of the input signal S_in conforms to the threshold condition, the temperature of the digital oscillator 920 is 20° C. At this moment, the stored code is "1010," and the second reference signal S_ref_2 is at a frequency of 5 GHz. However, when the amplitude of the input signal S_in does not conform to the threshold condition, the temperature of the digital oscillator 920 may be 70° C. At this moment, the code provided to the digital oscillator 920 is still "1010," but the second reference signal S_ref_2 may be at a frequency of less than or greater than 5 GHz.

Thus, in an exemplary embodiment, the connecting interface unit 900 further includes a temperature sensing module disposed between the detecting circuit 910 and the digital oscillator 920. When the amplitude of the input signal S_in conforms to the threshold condition, the temperature sensing module heats the digital oscillator 920 and records the codes that are for the digital oscillator 920 to generate the second reference signal S_ref_2 at different temperatures. All the codes are for generating the second reference signal S_ref_2 having a specific frequency (e.g. 5 GHz), and the codes are in bijection with the temperatures. When the amplitude of the input signal S_in does not conform to the threshold condition, the temperature sensing module detects a current temperature of the digital oscillator 920, generates a current code according to the current temperature and the recorded codes, and transmits the current code to the digital oscillator 920. For instance, if the current temperature is one of the recorded temperatures, the temperature sensing module uses the code to which the current temperature corresponds as the current code. On the contrary, if the current temperature is not one of the recorded temperatures, the temperature sensing module obtains the current code through interpolation or extrapolation according to the current temperature and the recorded codes. The digital oscillator 920 oscillates according to the current code to generate the second reference signal S_ref_2. In this way, even if the host system 1000 is not transmitting data to the memory storage device 100, when the digital oscillator 920 varies in temperature, the digital oscillator 920 is still able to generate the second reference signal S_ref_2 having a frequency of 5 GHz according to the current code.

Figure 10:
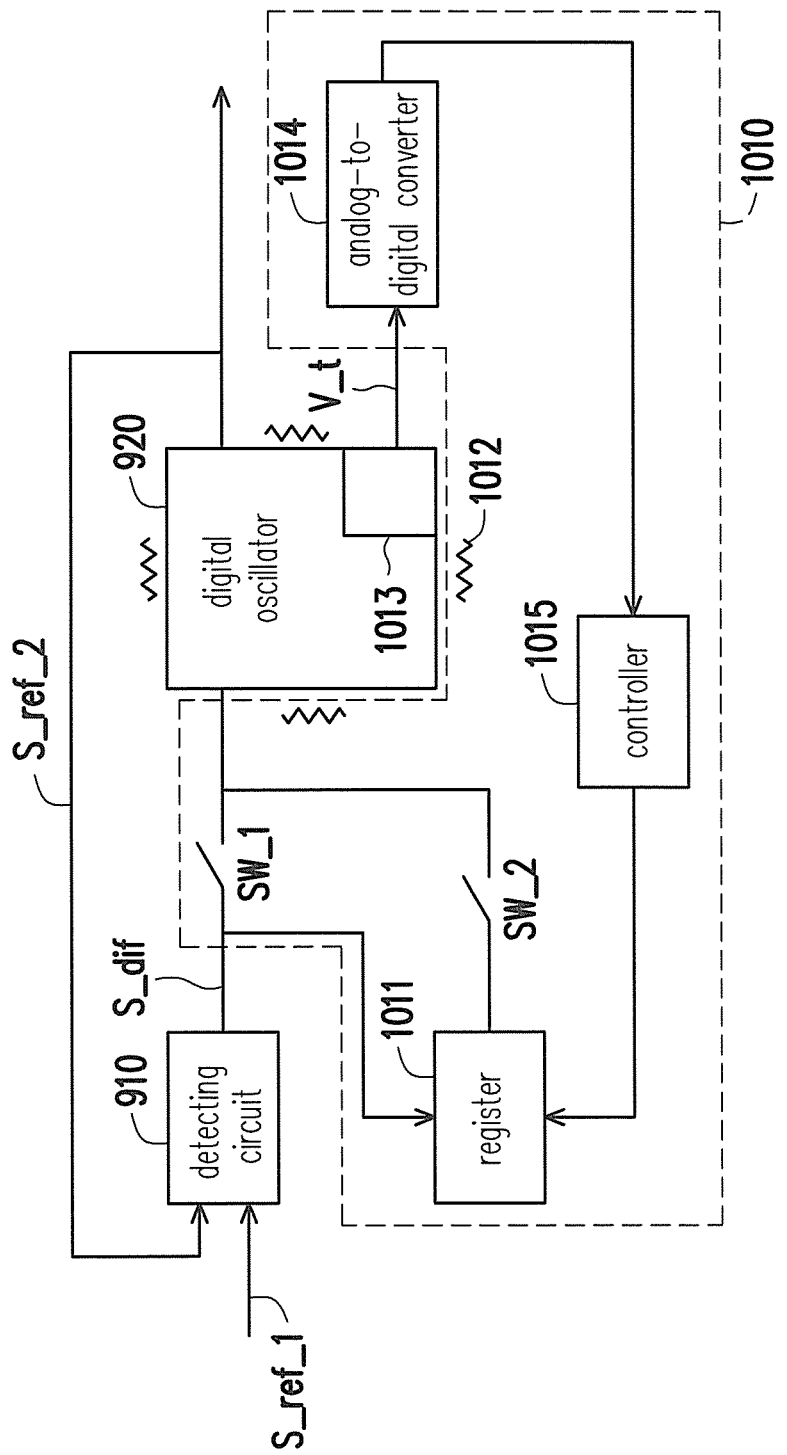
FIG. 10 is a circuit diagram of a temperature sensing module according to the fourth exemplary embodiment.

FIG. 10 is a circuit diagram of a temperature sensing module according to the fourth exemplary embodiment. Referring to FIG. 10, a temperature sensing module 1010 includes a register 1011, a first switch SW_1, a second switch SW_2, a heater 1012, a temperature sensor 1013, an analog-to-digital converter 1014, and a controller 1015. The register 1011 is coupled to the detecting circuit 910. The first switch SW_1 is coupled between the detecting circuit 910 and the digital oscillator 920. The second switch SW_2 is coupled between the register 1011 and the digital oscillator 920. When the amplitude of the input signal S_in conforms to the threshold condition, the controller 1015 conducts the first switch SW_1 and cuts off the second switch SW_2, so as to transmit the difference signal S_dif to the digital oscillator 920. In addition, the controller 1015 drives the heater 1012 to heat the digital oscillator 920. The heater 1012 is, for example, a resistor. However, the invention is not limited thereto. The temperature sensor 1013 continuously detects the temperature of the digital oscillator 920 and outputs a plurality of voltages V_t. For instance, the higher the temperature of the digital oscillator 920 is when the level of the voltage V_t becomes lower. The analog-to-digital converter 1014 converts the voltages V_t that represent temperatures into a plurality of digital data. In such heating process, the controller 1015 obtains a plurality of codes (corresponding to the temperatures) used by the digital oscillator 920, and stores the codes and the aforementioned digital data in a configuration table in the register 1011.

Figures 11, 12:
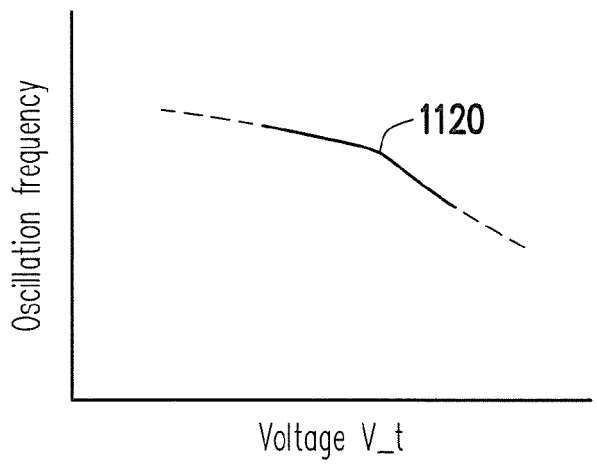
FIG. 11 illustrates a frequency-voltage curve of a digital oscillator according to the fourth exemplary embodiment.
FIG. 12 is a schematic diagram of a configuration table recorded in a register according to the fourth exemplary embodiment.

FIG. 11 illustrates a frequency-voltage curve of a digital oscillator according to the fourth exemplary embodiment. Referring to FIG. 11, in the present exemplary embodiment, the greater the value of the input code is, an oscillation frequency of the digital oscillator 920 becomes greater. When the temperature gets higher (the voltage V_t gets lower), even if the same code is input, the oscillation frequency of the digital oscillator 920 still increases (as shown by a curve 1120). Thus, when the temperature gets higher, in order to output the second reference signal S_ref_2 having a fixed frequency, the digital oscillator 920 must use a code having a smaller value. FIG. 12 is a schematic diagram of a configuration table recorded in a register according to the fourth exemplary embodiment. Referring to FIG. 12, when the temperature gets higher (the voltage V_t gets lower), the value of the code recorded in a configuration table 1200 decreases. It is worth noting that the temperatures in FIG. 12 only serve to describe a relationship between the voltages V_t and the codes. The configuration table 1200 does not record exact temperatures.

Referring to both FIG. 10 and FIG. 12, when the amplitude of the input signal S_in does not conform to the threshold condition, the controller 1015 cuts off the first switch SW_1 and conducts the second switch SW_2. At this moment, the temperature sensor 1013 detects the current temperature of the digital oscillator 920 and outputs the voltage V_t. The analog-to-digital converter 1014 converts the voltage V_t that represents the current temperature into digital data. If the digital data is the same as the digital data recorded in the register 1011, the controller 1015 outputs a corresponding code as the current code. For instance, if the voltage that represents the current temperature is 0.74 V, the controller 1015 outputs a code "10010" to the digital oscillator 920. However, if the voltage V_t that represents the current temperature is different from the voltages V_t recorded in the register 1011, the controller 1015 generates the current code in an interpolation or extrapolation manner. For instance, if the voltage V_t that represents the current temperature is 0.80 V, the controller 1015 obtains the current code "10040" through extrapolation, and outputs the current code "10040" to the digital oscillator 920. In the present exemplary embodiment, the controller 1015 obtains the current code through interpolation/extrapolation using a linear algorithm. However, in another exemplary embodiment, the controller 1015 defines a nonlinear function according to the codes and digital data in the configuration table 1200, and calculates the current code using the nonlinear function and the voltage V_t that represents the current temperature.

Figure 13:
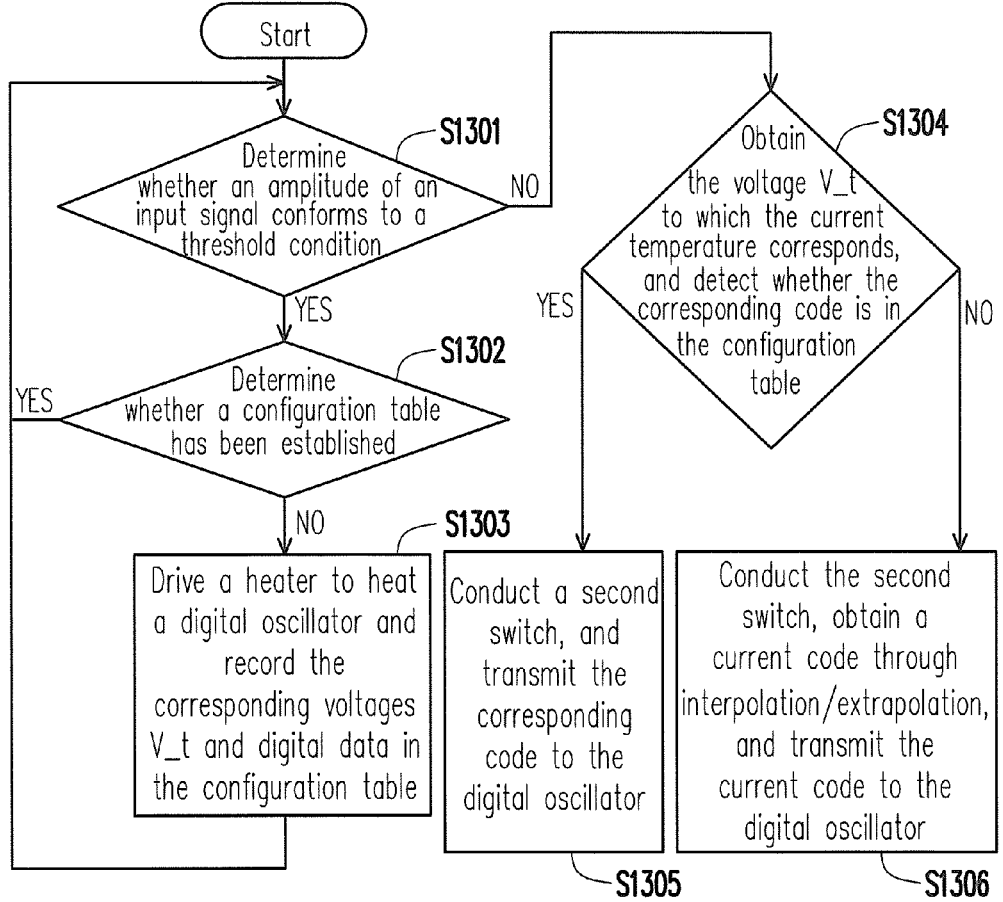
FIG. 13 is an operation flow chart of the temperature sensing module according to the fourth exemplary embodiment.

FIG. 13 is an operation flow chart of the temperature sensing module according to the fourth exemplary embodiment. Referring to FIG. 13, in step S1301, the controller 1015 determines whether the amplitude of the input signal S_in conforms to the threshold condition. If the amplitude of the input signal S_in conforms to the threshold condition, in step S1302, the controller 1015 determines whether a configuration table has been established. If the configuration table has been established, the controller 1015 returns to step S1301. If the configuration table has not been established, in step S1303, the controller 1015 drives the heater 1012 to heat the digital oscillator 920 and records the corresponding voltages V_t and digital data in the configuration table. If the amplitude of the input signal S_in does not conform to the threshold condition, in step S1304, the controller 1015 obtains the voltage V_t to which the current temperature corresponds, and detects whether the corresponding code is in the configuration table. If the corresponding code is in the configuration table, in step S1305, the controller 1015 conducts the second switch, and transmits the corresponding code to the digital oscillator 920. If the corresponding code is not in the configuration table, in step S1306, the controller 1015 conducts the second switch, obtains the current code through interpolation/extrapolation, and transmits the current code to the digital oscillator 920. The steps in FIG. 13 have been described above and thus are not explained in detail here.

[Fifth Exemplary Embodiment]

Figure 14:
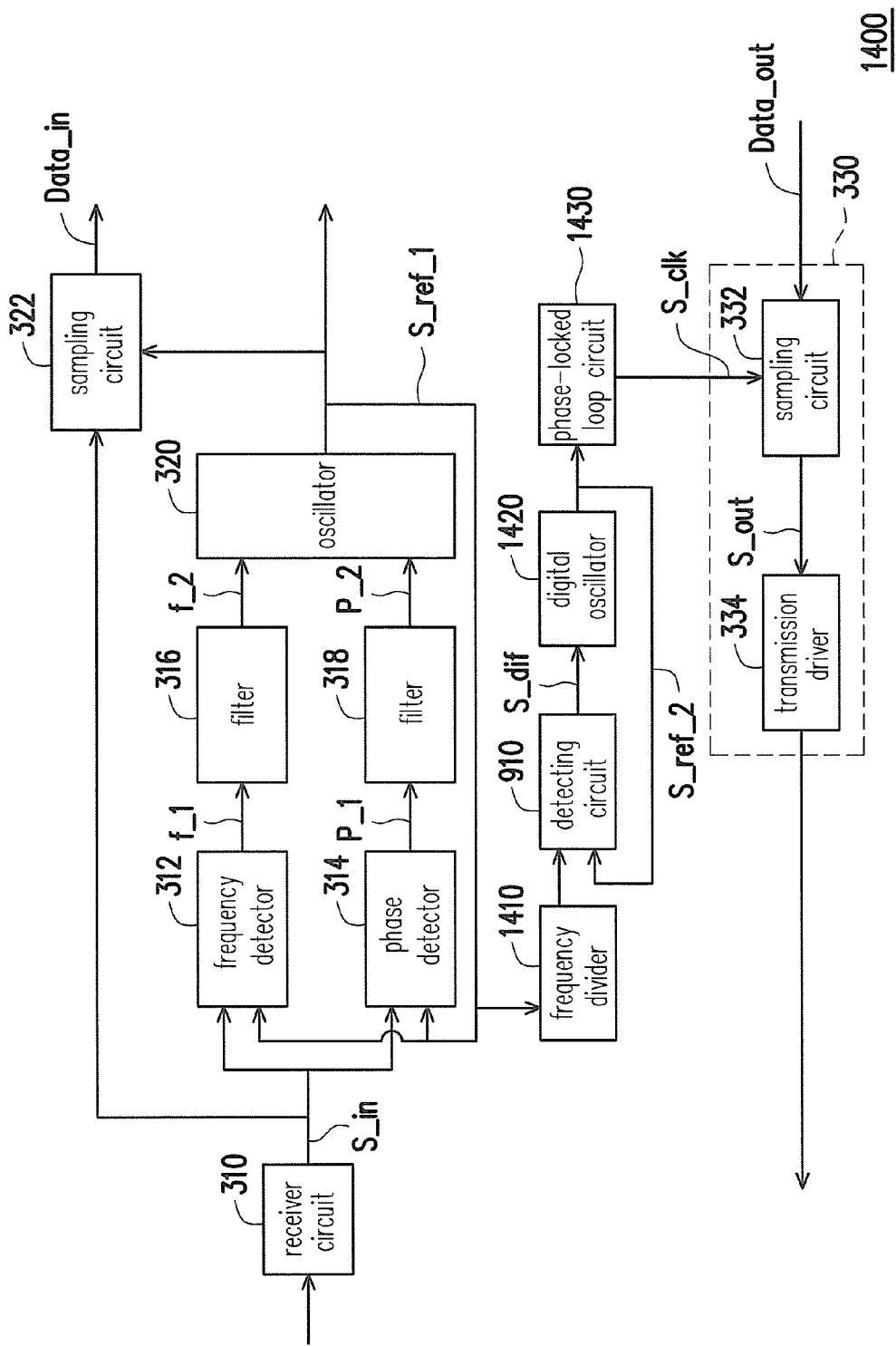
FIG. 14 is a partial block diagram of a connecting interface unit according to the fifth exemplary embodiment.

Elements in the fifth exemplary embodiment are partially the same as those in the fourth exemplary embodiment, and only differences are described in the following. FIG. 14 is a partial block diagram of a connecting interface unit according to the fifth exemplary embodiment. Referring to FIG. 14, in addition to the elements illustrated in FIG. 9, a connecting interface unit 1400 further includes a frequency divider 1410 and a phase-locked loop circuit 1430. Moreover, the digital oscillator 920 in FIG. 9 has been replaced with a digital oscillator 1420.

The frequency divider 1410 is coupled to the detecting circuit 910, the oscillator 320, the frequency detector 312 and the phase detector 314. The frequency divider 1410 lowers the frequency of the first reference signal S_ref_1, for example, by dividing the frequency of the first reference signal S_ref_1 by a positive integer. The frequency divider 1410 transmits the first reference signal S_ref_1 of which the frequency is lowered to the detecting circuit 910. The detecting circuit 910 detects a signal character difference between the first reference signal S_ref_1 and the second reference signal S_ref_2 to generate the difference signal S_dif. The digital oscillator 1420 oscillates according to the difference signal S_dif to generate the second reference signal S_ref_2. The phase-locked loop circuit 1430 is coupled to the digital oscillator 1420 and the transmitter circuit 330, and generates the clock signal S_clk according to the second reference signal S_ref_2. For instance, the first reference signal S_ref_1 is at a frequency of 5 GHz and the second reference signal S_ref_2 is at a frequency of 25 MHz (megahertz). Moreover, the phase-locked loop circuit 1430 generates the clock signal S_clk having a frequency of 5 GHz. Generally speaking, the higher the frequency of the second reference signal S_ref_2 is, the cost of the digital oscillator 920 gets higher and the more difficult it is to dispose the oscillator 920. Thus, the digital oscillator 920 in FIG. 9 is replaced with the digital oscillator 1420 in FIG. 14 so as to reduce the cost of the connecting interface unit 1400.

It is worth noting that a storage unit or the temperature sensing module 1010 may also be disposed between the digital oscillator 1420 and the detecting circuit 910. The disposing and operating manners thereof have been described as above, and thus are not repeated here.

[Sixth Exemplary Embodiment]

Figure 15:
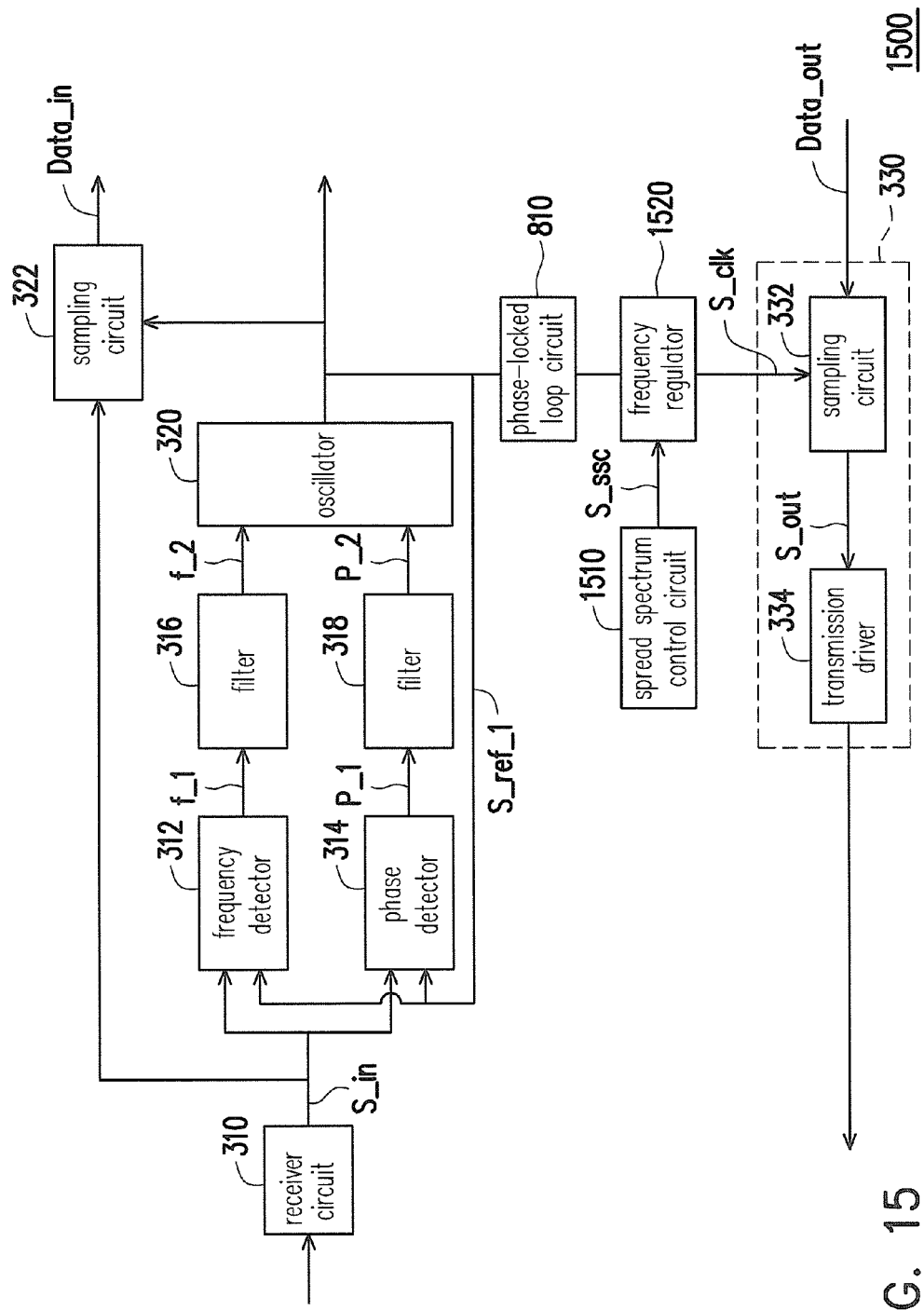
FIG. 15 is a partial block diagram of a connecting interface unit according to the sixth exemplary embodiment.

Elements in the sixth exemplary embodiment are partially the same as those in the third exemplary embodiment, and only differences are described in the following. FIG. 15 is a partial block diagram of a connecting interface unit according to the sixth exemplary embodiment. Referring to FIG. 15, in addition to the elements illustrated in FIG. 8, a connecting interface unit 1500 further includes a spread spectrum control circuit 1510 and a frequency regulator 1520, wherein the frequency regulator 1520 is coupled to the spread spectrum control circuit 1510 and the phase-locked loop circuit 810.

In an exemplary embodiment, a signal from the host system 1000 is subjected to a spread spectrum (SS) operation (also referred as first spread spectrum operation). After passing through the frequency detector 312, the phase detector 314, the filter 316, the filter 318 and the oscillator 320, an effect of the first spread spectrum operation in the first reference signal S_ref_1 is eliminated. However, a signal transmitted to the host system 1000 may need to be subjected to a spread spectrum operation in order to conform to the requirements of a transmission standard (e.g. USB or SATA). In the present exemplary embodiment, the spread spectrum control circuit 1510 is configured to provide a spread spectrum signal S_ssc. The spread spectrum signal S_ssc may be a square-wave signal, a triangular-wave signal, or a signal of any waveform. The invention is not limited thereto. The frequency regulator 1520 performs a spread spectrum operation (also referred as second spread spectrum operation) on the clock signal S_clk from the phase-locked loop circuit 810 according to the spread spectrum signal S_ssc, and transmits the clock signal S_clk on which the second spread spectrum operation has been performed to the transmitter circuit 330. That is to say, the frequency of the clock signal S_clk on which the second spread spectrum operation has been performed varies within a specified range with time, so that signal energy is distributed in a frequency band, thereby inhibiting electromagnetic interference (EMI) of the signals. A range of the second spread spectrum operation is, for example, 0-±5000 ppm (parts per million). In the present exemplary embodiment, the frequency regulator 1520 may be a phase interpolator or a frequency divider/multiplier. The invention is not limited thereto.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A connecting interface unit without a crystal oscillator, comprising:
    a frequency detector configured to receive an input signal from a host system, and to detect a frequency difference between the input signal and a first reference signal to generate a first frequency signal;
    a phase detector configured to receive the input signal from the host system, and to detect a phase difference between the input signal and the first reference signal to generate a first phase signal;
    at least one filter configured to filter the first frequency signal to generate a second frequency signal, and to filter the first phase signal to generate a second phase signal;
    an oscillator coupled to the at least one filter, the frequency detector and the phase detector, and configured to oscillate according to the second frequency signal and the second phase signal to generate the first reference signal, wherein the first reference signal is for generating a clock signal;
    a first sampling circuit coupled to the oscillator and configured to generate an input data signal according to the first reference signal;
    a transmitter circuit, not receiving a reference clock from a crystal oscillator, coupled to the oscillator and configured to modulate an output data signal according to the clock signal to generate an output signal, and to transmit the output signal to the host system; and
    a storage unit coupled to the at least one filter and the oscillator, and configured to store an oscillation information of the second frequency signal or the second phase signal if an amplitude of the input signal conforms to a threshold condition,
    wherein the storage unit is configured to provide the oscillation information to the oscillator if the amplitude of the input signal does not conform to the threshold condition, and the oscillator is configured to oscillate according to the oscillation information to generate the first reference signal.

2. The connecting interface unit of claim 1, wherein the at least one filter comprises a first filter and a second filter, the first filter being coupled to the frequency detector, the second filter being coupled to the phase detector, and wherein the storage unit comprises:
    an amplifier comprising a first terminal, a second terminal and an output terminal, wherein the first terminal of the amplifier is coupled to the second filter, and the second terminal of the amplifier is coupled to the output terminal of the amplifier;
    a capacitor, wherein a first terminal of the capacitor is coupled to the output terminal of the amplifier, and the capacitor is configured to store the oscillation information, wherein the oscillation information is a level of the first reference signal;
    a multiplexer comprising a first terminal, a second terminal and an output terminal, wherein the first terminal of the multiplexer is coupled to the second filter, the second terminal of the multiplexer is coupled to the output terminal of the amplifier, and the output terminal of the multiplexer is coupled to the oscillator,
    wherein the multiplexer outputs a signal at the first terminal of the multiplexer to the oscillator if the amplitude of the input signal conforms to the threshold condition,
    wherein the multiplexer outputs a signal at the second terminal of the multiplexer to the oscillator if the amplitude of the input signal does not conform to the threshold condition.

3. The connecting interface unit of claim 1, further comprising:
    a phase-locked loop circuit coupled to the oscillator and the transmitter circuit, and configured to generate the clock signal according to the first reference signal.

4. The connecting interface unit of claim 1, further comprising:
    a spread spectrum control circuit configured to provide a spread spectrum signal; and
    a frequency regulator coupled to the spread spectrum control circuit and the phase-locked loop circuit, and configured to perform a spread spectrum operation on the clock signal according to the spread spectrum signal, and to transmit the clock signal on which the spread spectrum operation has been performed to the transmitter circuit.

5. The connecting interface unit of claim 1, wherein the first reference signal is the same as the clock signal.

6. The connecting interface unit of claim 1, further comprising:
    a detecting circuit configured to detect a signal character difference between the first reference signal and a second reference signal to generate a difference signal; and a digital oscillator configured to oscillate according to the difference signal to generate the second reference signal, wherein the second reference signal is for generating the clock signal.

7. The connecting interface unit of claim 6, further comprising:
a frequency divider coupled to the detecting circuit, the oscillator, the frequency detector and the phase detector, and configured to lower a frequency of the first reference signal and to transmit the first reference signal of which the frequency is lowered to the detecting circuit; and
a phase-locked loop circuit coupled to the digital oscillator and the transmitter circuit, and configured to generate the clock signal according to the second reference signal.

8. The connecting interface unit of claim 6, further comprising:
a temperature sensing module configured to heat the digital oscillator if an amplitude of the input signal conforms to a threshold condition, and to record a plurality of codes of the digital oscillator at a plurality of temperatures, wherein the codes are in bijection with the temperatures, and the digital oscillator generates the second reference signal according to the codes,
wherein the temperature sensing module is configured to detect a current temperature of the digital oscillator if the amplitude of the input signal does not conform to the threshold condition, to generate a current code according to the current temperature and the codes, and to transmit the current code to the digital oscillator,
wherein the digital oscillator is configured to oscillate according to the current code to generate the second reference signal.

9. The connecting interface unit of claim 8, wherein if the current temperature is one of the temperatures, the temperature sensing module is configured to use the code to which the current temperature corresponds as the current code,
wherein if the current temperature is not one of the temperatures, the temperature sensing module is configured to interpolate or extrapolate the codes according to the current temperature to generate the current code.

10. The connecting interface unit of claim 8, wherein the temperature sensing module comprises:
a register coupled to the detecting circuit;
a first switch coupled between the detecting circuit and the digital oscillator;
a second switch coupled between the register and the digital oscillator;
a heater configured to heat the digital oscillator;
a temperature sensor configured to detect the temperatures and the current temperature to output a plurality of voltages;
an analog-to-digital converter configured to convert the voltages into a plurality of digital data; and
a controller configured to store the digital data and the codes in the register,
wherein if the amplitude of the input signal conforms to the threshold condition, the controller is configured to conduct the first switch and cut off the second switch,
wherein if the amplitude of the input signal does not conform to the threshold condition, the controller is configured to cut off the first switch and conduct the second switch, and to generate the current code according to the current temperature and the codes.

11. The connecting interface unit of claim 1, further comprising a receiver circuit coupled to the frequency detector and the phase detector, and configured to receive a signal from the host system and to compensate or filter the signal to generate the input signal.

12. The connecting interface unit of claim 11, wherein the receiver circuit is an equalizer comprising:
a first inductor having a first terminal coupled to a system voltage;
a first resistor having a first terminal coupled to a second terminal of the first inductor;
a first transistor having a first terminal coupled to a second terminal of the first resistor;
a second inductor having a first terminal coupled to the system voltage;
a second resistor having a first terminal coupled to a second terminal of the second inductor;
a second transistor having a first terminal coupled to a second terminal of the second resistor;
a third resistor comprising a first terminal and a second terminal, wherein the first terminal of the third resistor is coupled to a second terminal of the first transistor, and the second terminal of the third resistor is coupled to a second terminal of the second transistor;
a first capacitor comprising a first terminal and a second terminal, wherein the first terminal of the first capacitor is coupled to the second terminal of the first transistor and the first terminal of the third resistor, and the second terminal of the first capacitor is coupled to the second terminal of the second transistor and the second terminal of the third resistor;
a first current source coupled to the second terminal of the first transistor, the first terminal of the third resistor and the first terminal of the first capacitor; and
a second current source coupled to the second terminal of the second transistor, the second terminal of the third resistor, and the second terminal of the first capacitor,
wherein the signal from the host system is input between a control terminal of the first transistor and a control terminal of the second transistor,
wherein a potential difference between the first terminal of the first transistor and the first terminal of the second transistor forms the input signal.

13. The connecting interface unit of claim 1, wherein the transmitter circuit comprises:
a second sampling circuit configured to modulate the output data signal according to the clock signal to generate the output signal; and
a transmission driver coupled to the second sampling circuit and configured to transmit the output signal to the host system.

14. The connecting interface unit of claim 13, wherein the transmission driver comprises:
a fourth resistor having a first terminal coupled to a system voltage;
a third transistor having a first terminal coupled to a second terminal of the fourth resistor;
a fifth resistor having a first terminal coupled to the system voltage;
a fourth transistor having a first terminal coupled to a second terminal of the fifth resistor;
a third current source couple to a second terminal of the third transistor and a second terminal of the fourth transistor,
wherein the output signal is input between a control terminal of the third transistor and a control terminal of the fourth transistor, wherein a potential difference between the first terminal of the third transistor and the first terminal of the fourth transistor forms the output signal transmitted to the host system.

15. A memory storage device, comprising:
a connecting interface unit configured to be coupled to a host system;
a rewritable non-volatile memory module comprising a plurality of physical erasing units; and
a memory controller coupled to the connecting interface unit and the rewritable non-volatile memory module,
wherein the connecting interface unit does not comprise a crystal oscillator, and the connecting interface unit comprises:
a frequency detector configured to receive an input signal from the host system, and to detect a frequency difference between the input signal and a first reference signal to generate a first frequency signal;
a phase detector configured to receive the input signal from the host system, and to detect a phase difference between the input signal and the first reference signal to generate a first phase signal;
at least one filter configured to filter the first frequency signal to generate a second frequency signal, and to filter the first phase signal to generate a second phase signal;
an oscillator coupled to the at least one filter, the frequency detector and the phase detector, and configured to oscillate according to the second frequency signal and the second phase signal to generate the first reference signal, wherein the first reference signal is for generating a clock signal;
a first sampling circuit coupled to the oscillator and configured to generate an input data signal according to the first reference signal;
a transmitter circuit, not receiving a reference clock from a crystal oscillator, configured to modulate an output data signal according to the clock signal to generate an output signal, and to transmit the output signal to the host system; and
a storage unit coupled to the at least one filter and the oscillator, and configured to store an oscillation information of the second frequency signal or the second phase signal if an amplitude of the input signal conforms to a threshold condition,
wherein the storage unit is configured to provide the oscillation information to the oscillator if the amplitude of the input signal does not conform to the threshold condition, and the oscillator is configured to oscillate according to the oscillation information to generate the first reference signal.

16. The memory storage device of claim 15, wherein the at least one filter comprises a first filter and a second filter, the first filter being coupled to the frequency detector, the second filter being coupled to the phase detector, and wherein the storage unit comprises:
an amplifier comprising a first terminal, a second terminal and an output terminal, wherein the first terminal of the amplifier is coupled to the second filter, and the second terminal of the amplifier is coupled to the output terminal of the amplifier;
a capacitor, wherein a first terminal of the capacitor is coupled to the output terminal of the amplifier, and the capacitor is configured to store the oscillation information, wherein the oscillation information is a level of the first reference signal;
a multiplexer comprising a first terminal, a second terminal and an output terminal, wherein the first terminal of the multiplexer is coupled to the second filter, the second terminal of the multiplexer is coupled to the output terminal of the amplifier, and the output terminal of the multiplexer is coupled to the oscillator,
wherein the multiplexer outputs a signal at the first terminal of the multiplexer to the oscillator if the amplitude of the input signal conforms to the threshold condition,
wherein the multiplexer outputs a signal at the second terminal of the multiplexer to the oscillator if the amplitude of the input signal does not conform to the threshold condition.

17. The memory storage device of claim 15, wherein the connecting interface unit further comprises:
a phase-locked loop circuit coupled to the oscillator and the transmitter circuit, and configured to generate the clock signal according to the first reference signal.

18. The memory storage device of claim 17, wherein the connecting interface unit further comprises:
a spread spectrum control circuit configured to provide a spread spectrum signal; and
a frequency regulator coupled to the spread spectrum control circuit and the phase-locked loop circuit, and configured to perform a spread spectrum operation on the clock signal according to the spread spectrum signal, and to transmit the clock signal on which the spread spectrum operation has been performed to the transmitter circuit.

19. The memory storage device of claim 15, wherein the first reference signal is the same as the clock signal.

20. The memory storage device of claim 15, wherein the connecting interface unit further comprises:
a detecting circuit configured to detect a signal character difference between the first reference signal and a second reference signal to generate a difference signal; and
a digital oscillator configured to oscillate according to the difference signal to generate the second reference signal, wherein the second reference signal is for generating the clock signal.

21. The memory storage device of claim 20, wherein the connecting interface unit further comprises:
a frequency divider coupled to the detecting circuit, the oscillator, the frequency detector and the phase detector, and configured to lower a frequency of the first reference signal and to transmit the first reference signal of which the frequency is lowered to the detecting circuit; and
a phase-locked loop circuit coupled to the digital oscillator and the transmitter circuit, and configured to generate the clock signal according to the second reference signal.

22. The memory storage device of claim 20, wherein the connecting interface unit further comprises:
a temperature sensing module configured to heat the digital oscillator if an amplitude of the input signal conforms to a threshold condition, and to record a plurality of codes of the digital oscillator at a plurality of temperatures, wherein the codes are in bijection with the temperatures, and the digital oscillator generates the second reference signal according to the codes,
wherein the temperature sensing module is configured to detect a current temperature of the digital oscillator if the amplitude of the input signal does not conform to the threshold condition, to generate a current code according to the current temperature and the codes, and to transmit the current code to the digital oscillator,
wherein the digital oscillator is configured to oscillate according to the current code to generate the second reference signal.

23. The memory storage device of claim 22, wherein if the current temperature is one of the temperatures, the temperature sensing module is configured to use the code to which the current temperature corresponds as the current code,
wherein if the current temperature is not one of the temperatures, the temperature sensing module is configured to interpolate or extrapolate the codes according to the current temperature to generate the current code.

24. The memory storage device of claim 22, wherein the temperature sensing module comprises:
a register coupled to the detecting circuit;
a first switch coupled between the detecting circuit and the digital oscillator;
a second switch coupled between the register and the digital oscillator;
a heater configured to heat the digital oscillator;
a temperature sensor configured to detect the temperatures and the current temperature to output a plurality of voltages;
an analog-to-digital converter configured to convert the voltages into a plurality of digital data; and
a controller configured to store the digital data and the codes in the register,
wherein if the amplitude of the input signal conforms to the threshold condition, the controller is configured to conduct the first switch and cut off the second switch,
wherein if the amplitude of the input signal does not conform to the threshold condition, the controller is configured to cut off the first switch and conduct the second switch, and to generate the current code according to the current temperature and the codes.

25. The memory storage device of claim 15, wherein the connecting interface unit further comprises:
a receiver circuit coupled to the frequency detector and the phase detector, and configured to receive a signal from the host system and to compensate or filter the signal to generate the input signal.

26. The memory storage device of claim 25, wherein the receiver circuit is an equalizer comprising:
a first inductor having a first terminal coupled to a system voltage;
a first resistor having a first terminal coupled to a second terminal of the first inductor;
a first transistor having a first terminal coupled to a second terminal of the first resistor;
a second inductor having a first terminal coupled to the system voltage;
a second resistor having a first terminal coupled to a second terminal of the second inductor;
a second transistor having a first terminal coupled to a second terminal of the second resistor;
a third resistor comprising a first terminal and a second terminal, wherein the first terminal of the third resistor is coupled to a second terminal of the first transistor, and the second terminal of the third resistor is coupled to a second terminal of the second transistor;
a first capacitor comprising a first terminal and a second terminal, wherein the first terminal of the first capacitor is coupled to the second terminal of the first transistor and the first terminal of the third resistor, and the second terminal of the first capacitor is coupled to the second terminal of the second transistor and the second terminal of the third resistor;
a first current source coupled to the second terminal of the first transistor, the first terminal of the third resistor and the first terminal of the first capacitor; and
a second current source coupled to the second terminal of the second transistor, the second terminal of the third resistor, and the second terminal of the first capacitor,
wherein the signal from the host system is input between a control terminal of the first transistor and a control terminal of the second transistor,
wherein a potential difference between the first terminal of the first transistor and the first terminal of the second transistor forms the input signal.

27. The memory storage device of claim 15, wherein the transmitter circuit comprises:
a second sampling circuit configured to modulate the output data signal according to the clock signal to generate the output signal; and
a transmission driver coupled to the second sampling circuit and configured to transmit the output signal to the host system.

28. The memory storage device of claim 27, wherein the transmission driver comprises:
a fourth resistor having a first terminal coupled to a system voltage;
a third transistor having a first terminal coupled to a second terminal of the fourth resistor;
a fifth resistor having a first terminal coupled to the system voltage;
a fourth transistor having a first terminal coupled to a second terminal of the fifth resistor;
a third current source couple to a second terminal of the third transistor and a second terminal of the fourth transistor,
wherein the output signal is input between a control terminal of the third transistor and a control terminal of the fourth transistor,
wherein a potential difference between the first terminal of the third transistor and the first terminal of the fourth transistor forms the output signal transmitted to the host system.

* * * * *